United States Patent
Oh

(10) Patent No.: US 8,139,390 B2
(45) Date of Patent: Mar. 20, 2012

(54) MIXED DATA RATES IN MEMORY DEVICES AND SYSTEMS

(75) Inventor: HakJune Oh, Kanata (CA)

(73) Assignee: MOSAID Technologies Incorporated, Ottawa (CA)

( * ) Notice: Subject to any disclaimer, the term of this patent is extended or adjusted under 35 U.S.C. 154(b) by 921 days.

(21) Appl. No.: 12/169,115

(22) Filed: Jul. 8, 2008

(65) Prior Publication Data

US 2010/0011174 A1    Jan. 14, 2010

(51) Int. Cl.
*G11C 11/00* (2006.01)

(52) U.S. Cl. .......... 365/147; 711/154; 711/501

(58) Field of Classification Search .......... 365/147, 365/230.05, 191, 222, 189.05, 233, 211, 365/219, 230.02, 205, 193
See application file for complete search history.

(56) References Cited

U.S. PATENT DOCUMENTS

| | | | |
|---|---|---|---|
| 4,617,566 A | 10/1986 | Diamond | |
| 4,914,574 A | 4/1990 | Terada et al. | |
| 5,132,635 A | 7/1992 | Kennedy | |
| 5,204,669 A | 4/1993 | Dorfe et al. | |
| 5,243,703 A | 9/1993 | Farmwald et al. | |
| 5,319,598 A | 6/1994 | Aralis et al. | |
| 5,357,621 A | 10/1994 | Cix | |
| 5,404,460 A | 4/1995 | Thomsen et al. | |
| 5,430,859 A | 7/1995 | Norman et al. | |
| 5,475,854 A | 12/1995 | Thomsen et al. | |
| 5,671,178 A | 9/1997 | Park et al. | |
| 5,712,983 A * | 1/1998 | Vergnaud et al. ............. | 709/250 |
| 5,740,379 A | 4/1998 | Hartwig | |
| 5,778,419 A | 7/1998 | Hansen et al. | |
| 5,802,399 A | 9/1998 | Yumoto et al. | |
| 5,828,899 A | 10/1998 | Richard et al. | |
| 5,845,313 A | 12/1998 | Estakri et al. | |
| 5,859,809 A | 1/1999 | Kim | |
| 5,941,974 A | 8/1999 | Babin | |
| 6,002,638 A | 12/1999 | John | |
| 6,144,576 A | 11/2000 | Leddige et al. | |
| 6,148,364 A | 11/2000 | Srinivasan et al. | |
| 6,253,292 B1 | 6/2001 | Jhang et al. | |
| 6,304,921 B1 | 10/2001 | Rooke | |
| 6,317,350 B1 | 11/2001 | Pereira et al. | |
| 6,317,352 B1 | 11/2001 | Halbert et al. | |

(Continued)

FOREIGN PATENT DOCUMENTS

WO    WO 01/69411 A2    9/2001

OTHER PUBLICATIONS

STMicroelectronics, "2 Mbit, Low Voltage, Serial Flash Memory With 40MHz SPI Bus Interface", M25P20, Aug. 1, 2005, pp. 1-40.

(Continued)

*Primary Examiner* — Dang Nguyen
(74) *Attorney, Agent, or Firm* — Daniel A. Hammond

(57) ABSTRACT

Mixed data rates in a memory system is disclosed. The system includes at least one semiconductor memory device and another device defining a ring topology. The semiconductor memory device includes input circuitry for receiving a clock signal having a frequency at least substantially equal to a frequency x. A first set of circuit elements are each clocked by a same or respective first internal signal having a frequency at least substantially equal to the frequency x. A second set of circuit elements are each clocked by a same or a respective second internal signal having a frequency at least substantially double that of the frequency x.

25 Claims, 7 Drawing Sheets

U.S. PATENT DOCUMENTS

| | | | |
|---|---|---|---|
| 6,373,289 B1 | 4/2002 | Martin et al. | |
| 6,625,687 B1 | 9/2003 | Halbert et al. | |
| 6,658,509 B1 | 12/2003 | Bonnella et al. | |
| 6,680,904 B1 | 1/2004 | Kaplan et al. | |
| 6,697,936 B2 | 2/2004 | Johnson | |
| 6,763,426 B1 | 7/2004 | James et al. | |
| 6,816,933 B1 | 11/2004 | Andreas | |
| 6,850,443 B2 | 2/2005 | Lofgren et al. | |
| 6,853,557 B1 | 2/2005 | Haba et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,978,402 B2 | 12/2005 | Hirabayashi | |
| 6,996,644 B2 | 2/2006 | Schoch et al. | |
| 7,031,221 B2 | 4/2006 | Mooney et al. | |
| 7,057,911 B2 | 6/2006 | Klint | |
| 7,111,140 B2 | 9/2006 | Estakhri et al. | |
| 7,130,958 B2 | 10/2006 | Chou et al. | |
| 7,242,635 B2 | 7/2007 | Okuda | |
| 7,342,816 B2 | 3/2008 | Bartley et al. | |
| 7,885,140 B2 * | 2/2011 | Gillingham et al. | 365/233.1 |
| 2002/0122347 A1 | 9/2002 | Frulio et al. | |
| 2002/0188781 A1 | 12/2002 | Schoch et al. | |
| 2004/0001380 A1 | 1/2004 | Becca et al. | |
| 2004/0024960 A1 | 2/2004 | King et al. | |
| 2004/0148482 A1 | 7/2004 | Grundy et al. | |
| 2004/0150445 A1* | 8/2004 | Gomm et al. | 327/158 |
| 2005/0166006 A1 | 7/2005 | Talbot et al. | |
| 2006/0031593 A1 | 2/2006 | Sinclair | |
| 2006/0158214 A1* | 7/2006 | Janzen et al. | 326/30 |
| 2006/0198202 A1 | 9/2006 | Eraz | |
| 2007/0005831 A1 | 1/2007 | Gregorius | |
| 2007/0058480 A1 | 3/2007 | Hwang | |
| 2007/0064629 A1 | 3/2007 | Regev et al. | |
| 2007/0074091 A1 | 3/2007 | Go et al. | |
| 2007/0076479 A1 | 4/2007 | Kim et al. | |
| 2007/0076502 A1 | 4/2007 | Pyeon et al. | |
| 2007/0109833 A1 | 5/2007 | Pyeon et al. | |
| 2007/0143677 A1 | 6/2007 | Pyeon et al. | |
| 2007/0153576 A1 | 7/2007 | Oh et al. | |
| 2007/0233903 A1 | 10/2007 | Pyeon | |
| 2007/0233917 A1 | 10/2007 | Pyeon et al. | |
| 2007/0234071 A1 | 10/2007 | Pyeon | |
| 2007/0258295 A1 | 11/2007 | Kagan et al. | |
| 2008/0016269 A1 | 1/2008 | Chow et al. | |
| 2008/0052449 A1 | 2/2008 | Kim et al. | |
| 2008/0080492 A1 | 4/2008 | Pyeon et al. | |
| 2008/0137458 A1* | 6/2008 | Yoon et al. | 365/205 |
| 2008/0168296 A1 | 7/2008 | Oh et al. | |
| 2008/0201548 A1 | 8/2008 | Przybylski et al. | |
| 2008/0201588 A1 | 8/2008 | Pyeon et al. | |
| 2008/0226004 A1 | 9/2008 | Oh et al. | |

OTHER PUBLICATIONS

Micron Technology Inc., "4Gb, 8Gb, and 16Gb x8 NAND Flash Memory Features, NAND Flash Memory, MT29F4G08AAA, MT29F8G08BAA, MT29F8GO8DAA, MT29F16G08FAA", Feb. 2007, pp. 1-81.
Ameer, Shahed, "Enabling Platform Non-Volatile Memory Solutions", Intel Developer Forum, 2007.
ONFi, "Open NAND Flash Interface Specification", Revision 1.0, Dec. 28, 2006, pp. 1-106.
ONFI Workgroup, "Open NAND Flash Interface Specification", Revision 2.0, ONFI Workgroup, Feb. 27, 2008, pp. 1-174.
"Microchip Product Description 24AA1025/24LC1025/24FC1025", Microchip Technology Inc., 2006.
Toshiba, "NAND Flash Applications Design Guide," Revision 1.0, Toshiba America Electronics Components, Inc., (Apr. 2003).
Samsung Electronics, "K9XXG08UXM Preliminary Flash Memory," Technical Specification, Samsung Electronics, May 3, 2005, 43 pages.
Amtel, "8-megabit 2.5-volt Only or 2.7-volt Only DataFlash®," Technical Specification, Atmel, Rev. 2225H-DFLSH (2004).
Hypertransport, "HyperTransport TM I/O Link Specification", Revision 3.00, Document No. HTC20051222-0046-0008, Hypertransport Technology Consortium, pp. 1-428, Apr. 21, 2006.
Samsung Electronics, "DDR2 Fully Buffered DIMM 240pin FBDIMMS based on 512Mb C-die" Rev. 1.3, Sep. 2006, pp. 1-32, Sep. 2006.
Diamond, S.L., "SyncLink: High: High-speed DRAM for the Future", Micro Standards, IEEE Micro, pp. 74-75, Dec. 1996.
Gjessing, S., et al., "A RAM Link for High Speed", Special Report/Memory, IEEE Spectrum, pp. 52-53, Oct. 1992.
Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.
Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.
Oshima, et al., "High-Speed Memory Architectures for Multimedia Applications", Circuits & Devices, IEEE 8755-3996/97, pp. 8-13, Jan. 1997.
Kim, et al. "A 120-mm2 64 Mb NAND Flash Memory Archieving 180 ns/Byte Effective Program Speed," IEEE Journal of Solid-State Circuits, vol. 32, No. 5, May 1977, pp. 670-680.
Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.
Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Session 7, Feb. 6-9, 2006, pp. 507-516, ISBN: 1-4244-0079-1.
Samsung Electronics Co. Ltd, "256M x 8 Bit / 128 M x 16 Bit / 512M x 8 Bit NAND Flash Memory", K9K4G08U1M, K9F2G08U0M, K9F2G16U0M, May 6, 2005, pp. 1-41.
Toshiba, "2GBIT (256M x 8 Bits) CMOS NAND E2PROM", TH58NVG1S3AFT05, May 19, 2003, pp. 1-32.
Amtel Corp., "High Speed Small Sectored SPI Flash Memory", pp. 1-22, 2006.
Spansion, 64 Megabit CMOS 3.0 Volt Flash Memory with 50MHz SPI, Spansion, pp. 1-22 (2006).
King, et al., "Communicating with Daisy Chained MCP42XXX Digital Potentiometers", Microchip AN747, pp. 1-8, 2001.
Intel Corporation, "Intel® Advanced+ Boot Block Flash Memory (C3)", May 2005, pp. 1-72.
M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.
Tal, A. "Guidelines for Integrating DiskOnChip in a Host System", AP-DOC-1004, Rev. 1.0, M-Systems Flash . Pioneers Ltd., pp. 1-15, 2004.
Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.
Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.
Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Cirucits Conference Feb. 15-19, 2004, vol. 1, pp. 414-415.
Hypertransport, "HyperTransport TM I/O Link Specification", Revision 2.00, Document No. HTC20031217-0036-00, Hypertransport Technology Consortium, pp. 1-325, Apr. 27, 2005.
"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

* cited by examiner

MIXED DATA RATES IN MEMORY DEVICES AND SYSTEMS

BACKGROUND OF THE DISCLOSURE

Today, many electronic devices include memory systems that are used to store information (data) utilized by the devices. For example, some digital audio players include memory systems that are used to store digitized audio that may be played by the player. Likewise, personal computers systems often employ memory systems to store software utilized by the personal computers.

In many electronic devices, memory systems often comprise a controller and one or more memory devices. The controller typically contains circuitry configured to control access to information stored in the memory devices. The controller's circuitry may contain logic configured to generate signals that are used to direct the memory devices to store and retrieve information.

The memory devices typically store the information in memory that is contained in the memory devices. The memory may be volatile or non-volatile. A memory device that contains volatile memory often loses the information when power is removed from the device. A memory device containing non-volatile memory retains the information even when the device is not powered.

In some memory systems, data and control signals are transferred between the controller and memory devices using a parallel bus. One example of a parallel bus approach is disclosed in "Open NAND Flash Interface Specification", Revision 2.0, Feb. 27, 2008.

The parallel bus allows the data and control signals to be transferred in parallel between the controller and the memory devices. Many wires may be used to implement the bus and, depending on the layout of the memory system, the wires may extend for some length.

There are several disadvantages associated with transferring data and control signals in parallel between a controller and memory devices. One disadvantage relates to the complexity involved in implementing such systems. For example, the number of wires needed to implement the parallel bus may be quite significant and require the use of multi-layered printed circuit boards (PCBs). Another disadvantage relates to signal quality in the memory system. For example, parallel buses tend to be susceptible to crosstalk, signal skew, signal attenuation and noise, which may affect the quality of the signals carried by the wires. Another disadvantage associated with parallel bus designs relates to power consumption. Parallel bus designs tend to require a significant amount of power in order to drive the signals on the bus.

Accordingly, there is a need in the industry for improved memory devices and systems.

SUMMARY

It is an object of the invention to provide improved memory devices and systems.

According to one aspect of the invention, there is provided a system including at least one semiconductor memory device and another device defining a ring topology. The semiconductor memory device includes input circuitry for receiving a clock signal having a frequency at least substantially equal to a frequency x. A first set of circuit elements are each clocked by a same or respective first internal signal having a frequency at least substantially equal to the frequency x. A second set of circuit elements are each clocked by a same or a respective second internal signal having a frequency at least substantially double that of the frequency x.

According to another aspect of the invention, there is provided a method carried out in a semiconductor memory device having at least one data input and at least one data output. The method includes clocking read data, when a read operation occurs, out through the data output, and at first rate that is at least double that of a second rate. The method also includes bypassing received command data, when received and when determined that the command data is intended for a next downstream semiconductor memory device. The bypassing of the received command data includes clocking the command data out through the data output at the second rate.

According to yet another aspect of the invention, there is provided a semiconductor memory device that carries out the above described method.

Thus, improved memory devices and systems have been provided.

BRIEF DESCRIPTION OF THE DRAWINGS

Reference will now be made, by way of example, to the accompanying drawings.

Similar or the same reference numerals may have been used in different figures to denote similar example features illustrated in the drawings.

DETAILED DESCRIPTION OF EXAMPLE EMBODIMENTS

Certain terms/expressions and symbols used herein have a specific meaning:

"#" as used herein means complement. As an example, CLK# is the complement of CLK.

"Current carrying electrode" as used herein means an electrode of a transistor that carries current such as, for example, the drain or source of a Field-Effect Transistor (FET), or the collector or emitter of a Bipolar Junction Transistor (BJT).

"Control electrode" as used herein means an electrode of a transistor having control function such as, for example, the gate of a FET, or the base of a BJT.

Figure 1:
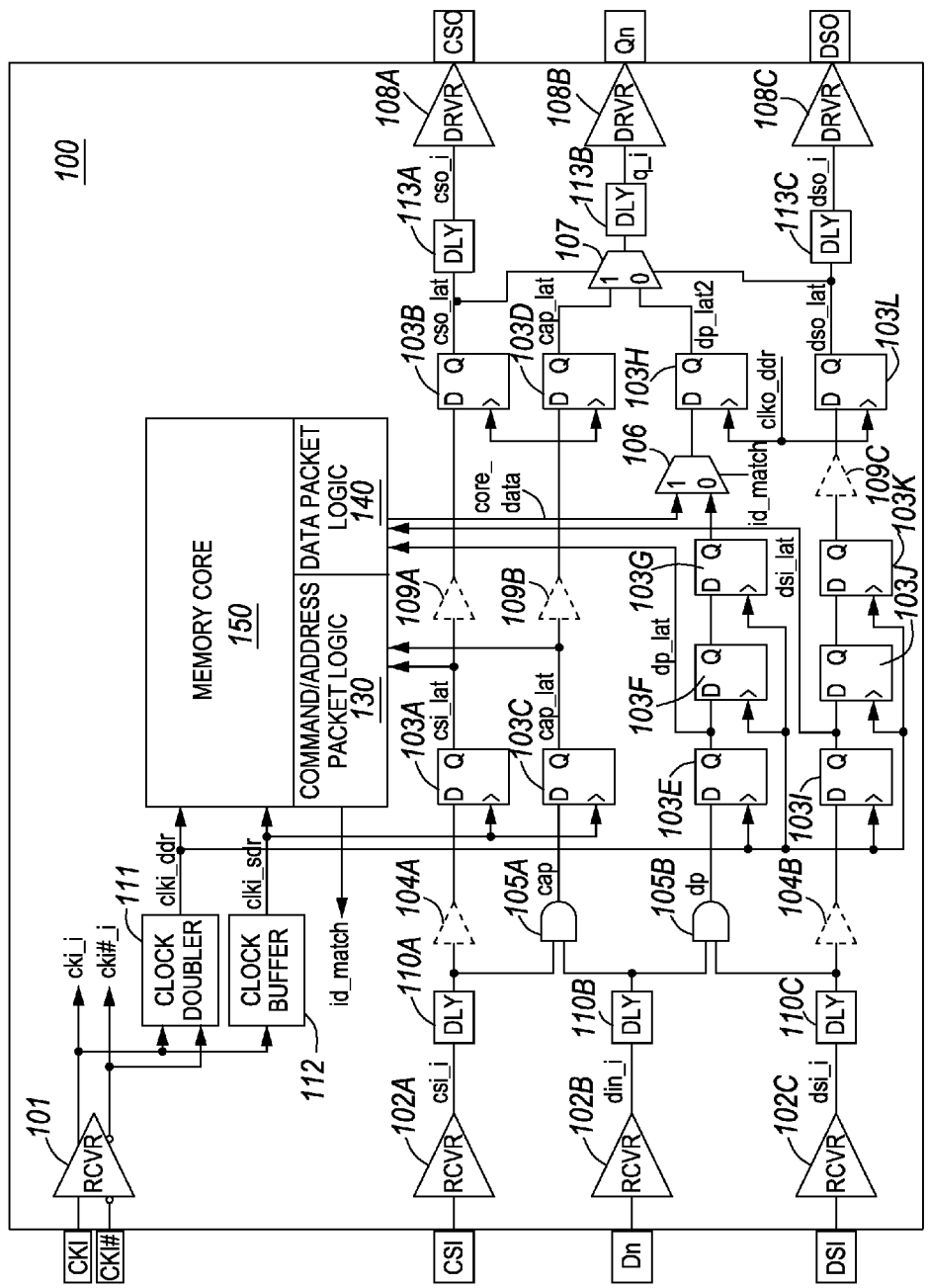
FIG. 1 is a simplified circuit schematic of a memory device in accordance with an example embodiment.

Referring now to FIG. 1, a memory device 100 in accordance with an example embodiment uses a highly multiplexed unidirectional point-to-point bus architecture to transfer information such as commands, addresses and data through a bus. In some examples, the bus comprises the following six signals: Command Strobe Input (CSI), Command Strobe Output (CSO), Data Strobe Input (DSI), Data Strobe Output (DSO), Data Input (Dn), and Data Output (Qn), where n=0 for a 1-bit width setting; n=0, 1 for a 2-bit width setting; n=0, 1, 2, 3 for a 4-bit width setting; n=0, 1, 2, 3, 4, 5, 6, 7 for an 8-bit width setting, etc. along with two differential clock input signals, CKI/CKI#.

The illustrated pins of the memory device 100 are coupled to associated input/output circuitries. Further details regarding the pins of the memory device 100 through which these signals are received or transmitted are provided in Table 1 below:

TABLE 1

Description of Pins

| Pin Name | Type | Description |
|---|---|---|
| CKI/CKI# | Input | Clock Inputs: CKI/CKI# are input clocks. In accordance with some examples, a Command/Address Packet on Dn that is delineated by CSI is latched on the rising edges of CKI and the falling edges of CKI#, and a Write Data Packet on Dn that is delineated by DSI is latched on both rising and falling edges of CKI/CKI#, and a Read Data Packet on Qn that is delineated by DSO is referenced at both rising edges of CKI/CKI# or CKO/CKO#. |
| CKO/CKO# | Output | Clock Outputs: CKO/CKO# are output clocks which are delayed or phase-locked version of CKI/CKI#. These pins are optional if a multi-drop style clocking is employed in the system. In accordance with some examples, CSO and its delineated Qn signals are referenced to the rising edges of CKO or to the falling edges of CKO#, and DSO and its delineated Qn signals are referenced to both rising and falling edges of CKO/CKO#. |
| Dn | Input | Data Input: Dn (n can be, for example, 0, 1, 2, 3, 4, 5, 6 or 7) receives command, address and input data. If the device 100 is configured in a 1-bit width mode, D0 is the only valid data signal and one byte of a packet is received in 8 clock cycles. If the device 100 is configured in a 2-bit width mode, D0 and D1 are the only valid data signals and one byte of a packet is received in 4 clock cycles. If the device 100 is configured in a 4-bit width mode, D0, D1, D2 and D3 are the valid data signals and one byte of a packet is received in 2 clock cycles. If the device 100 is configured in an 8-bit width mode, D0, D1, D2, D3, D4, D5, D6 and D7 are the valid data signals and one byte of a packet is received in 1 clock cycle. Unused data input pins are grounded. |
| Qn | Output | Data Output: Qn (n can be, for example, 0, 1, 2, 3, 4, 5, 6 or 7) transmits output data during a read operation, or alternatively bypasses command, address or input (write) data received on Dn. If the device 100 is configured in a 1-bit width mode, Q0 is the only valid data signal and one byte of a packet is transmitted in 8 clock cycles. If the device 100 is configured in a 2-bit width mode, Q0 and Q1 are the only valid data signals and one byte of a packet is transmitted in 4 clock cycles. If the device 100 is configured in a 4-bit width mode, Q0, Q1, Q2 and Q3 are the valid data signals and one byte of a packet is transmitted in 2 clock cycles. If the device 100 is configured in an 8-bit width mode, Q0, Q1, Q2, Q3, Q4, Q5, Q6 and Q7 are the valid data signals and one byte of a packet is transmitted in 1 clock cycle. Unused data output pins are Do Not Connect (DNC). |
| CSI | Input | Command Strobe Input: In accordance with some examples, when CSI is logical high, command/address packets through Dn are latched on the rising edges of CKI or falling edges of CKI#. |
| CSO | Output | Command Strobe Output: Echo signal of CSI. In accordance with some examples, CSO bypasses CSI transitions with two clock cycle latency referenced to the rising edges of CKO. |
| DSI | Input | Data Strobe Input: In accordance with some examples, if DSI is logical high while the device 100 is in 'Read-Mode', DSI enables the read data output path and a Qn buffer, and if DSI is logical low, the Qn buffer holds the previous data accessed, and if DSI is logical high while the device 100 is in 'Write-Mode', DSI enables a Dn buffer and receives Write Data Packet on both rising and falling edges of CKI/CKI#. |
| DSO | Output | Data Strobe Output: Echo signal of DSI. In accordance with some examples, DSO bypasses DSI transitions with two clock cycle latency referenced to both rising and falling edges of CKO, or with four half clock cycle latency referenced to both rising and falling edges of CKI/CKI#. |

Although not illustrated, in some examples the memory device 100 may receive common signals Chip Enable (CE#) and Reset (RST#). Also, in some examples the memory device 100 may include a programmable configuration register to force the width of data input and output pins of the memory device 100 to a specific width. This feature allows memory devices to operate in a ring configuration (see FIG. 2, for example) with devices of different physical widths provided they are all programmed to use the same link width. Further details relating to the setting of active widths are provided in commonly owned U.S. patent application Ser. No. 11/637,175 entitled "Memory System and Method with Serial and Parallel Modes" and U.S. patent application Ser. No. 12/033,577 entitled "System Having One or More Memory Devices", and the entire contents of these applications are herein incorporated by reference.

In the illustrated example embodiment, CKI/CKI# are the input clocks. In accordance with some examples, a Command/Address Packet on Dn that is delineated by CSI is latched on the rising edges of CKI and the falling edges of CKI#. Also in accordance with some examples, a Write Data Packet on Dn that is delineated by DSI is latched on both rising and falling edges of CKI/CKI#, and a Read Data Packet on Qn that is delineated by DSO is referenced at both rising edges of CKI/CKI#.

Figure 2:
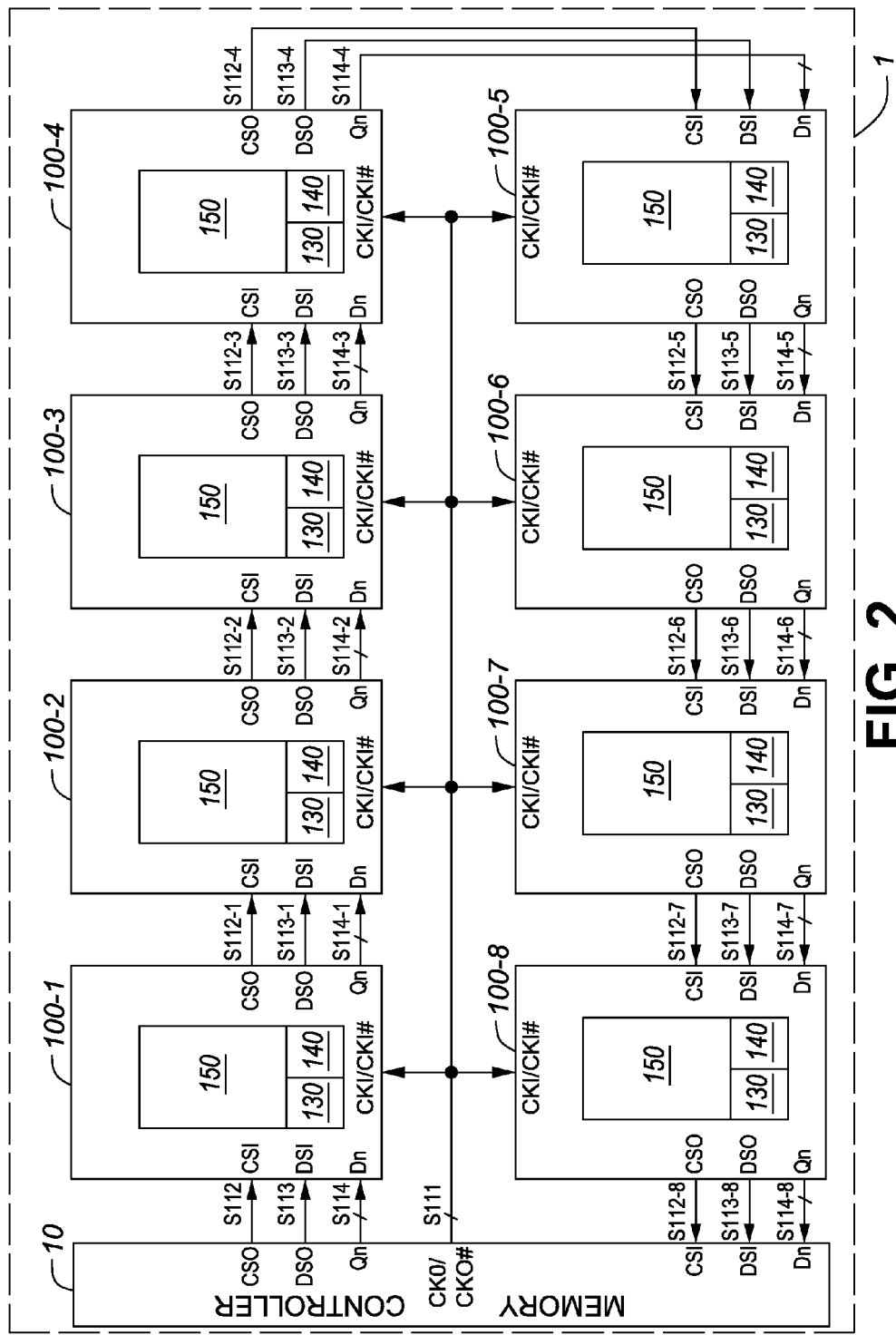
FIG. 2 is a block diagram of a memory system in accordance with an example embodiment.

CKO/CKO# are output clocks which are delayed or phase-locked version of CKI/CKI#. These pins are optional if a multi-drop style clocking is employed in the system (for instance, FIG. 2 shows multi-drop style clocking). In accordance with some examples, CSO and its delineated Qn signals are referenced to the rising edges of CKO or to the falling edges of CKO#, and DSO and its delineated Qn signals are referenced to both rising and falling edges of CKO/CKO#.

A Command Strobe Input (CSI) is shown in the illustrated example embodiment. In accordance with some examples, when CSI is logical high, command/address packets through Dn are latched on the rising edges of CKI or falling edges of CKI#.

Also shown in the illustrated example embodiment is a Command Strobe Output (CSO). CSO is an echo signal of CSI. In accordance with some examples, CSO bypasses CSI transitions with two clock cycle latency referenced to the rising edges of CKO. Those skilled in the art will appreciate that, in other examples, clock cycle latency may be some other number of clock cycles depending on design choices.

Also shown in the illustrated example embodiment is a Data Strobe Input (DSI). In accordance with some examples, if DSI is logical high while the device 100 is in 'Read-Mode', DSI enables the read data output path and a Qn buffer, and if DSI is logical low, the Qn buffer holds the previous data accessed, and if DSI is logical high while the device 100 is in 'Write-Mode', DSI enables a Dn buffer and receives Write Data Packet on both rising and falling edges of CKI/CKI#.

Data Strobe Output (DSO) is an echo signal of DSI. In accordance with some examples, DSO bypasses DSI transitions with four half clock cycle latency referenced to both rising and falling edges of CKI/CKI#. Because DSI and DSO are DDR based signals, the four half clock cycles latency is equivalent with two clock cycles. Those skilled in the art will appreciate that different latency values are possible according to design variations.

Data Input (Dn, where n can be, for example, 0, 1, 2, 3, 4, 5, 6 or 7) receives command, address and input data. If the device 100 is configured in a 1-bit width mode, D0 is the only valid data signal and one byte of a packet is received in 8 clock cycles. If the device 100 is configured in a 2-bit width mode, D0 and D1 are the only valid data signals and one byte of a packet is received in 4 clock cycles. If the device 100 is configured in a 4-bit width mode, D0, D1, D2 and D3 are the valid data signals and one byte of a packet is received in 2 clock cycles. If the device 100 is configured in an 8-bit width mode, D0, D1, D2, D3, D4, D5, D6 and D7 are the valid data signals and one byte of a packet is received in 1 clock cycle. Unused data input pins are grounded.

Data Output (Qn, where n can be, for example, 0, 1, 2, 3, 4, 5, 6 or 7) transmits output data during a read operation, or alternatively bypasses command, address or input (write) data received on Dn (this bypassing is described subsequently in more detail in connection with FIG. 5). If the device 100 is configured in a 1-bit width mode, Q0 is the only valid data signal and one byte of a packet is transmitted in 8 clock cycles. If the device 100 is configured in a 2-bit width mode, Q0 and Q1 are the only valid data signals and one byte of a packet is transmitted in 4 clock cycles. If the device 100 is configured in a 4-bit width mode, Q0, Q1, Q2 and Q3 are the valid data signals and one byte of a packet is transmitted in 2 clock cycles. If the device 100 is configured in an 8-bit width mode, Q0, Q1, Q2, Q3, Q4, Q5, Q6 and Q7 are the valid data signals and one byte of a packet is transmitted in 1 clock cycle. Unused data output pins are Do Not Connect (DNC).

Continuing reference is made FIG. 1, in which the illustrated memory device 100 includes a memory core 150 that may include one or more banks of memory cell arrays, depending on design variations. The illustrated memory device 100 also includes data packet logic 140, which comprises data path circuitry. As will be understood by those skilled in the art, the data path circuitry of the data packet logic 140 interfaces with the memory core 150 to allow data processing functionality to be provided. Command/Address Packet Logic 130 processes all command instructions and/or address information given through internal signal, 'cap_lat', based on an internal control signal 'csi_lat'. Input receiver logic 101 for CKI/CKI# is a differential-type input buffer for handling the differential clock inputs, CKI and CKI#. The input receiver logic 101 translates the external interface levels of the CKI/CKI# signals to the internal logic levels of 'cki_i' and 'cki#_i'. Cki_i and cki#_i may be used in other internal logic blocks for the various operations.

In the illustrated example embodiment, a clock doubler or clock doubling logic 111 is employed to derive a 'clki_ddr' signal which has a frequency twice that of the cki_i signal, and which is used to clock each circuit element belonging to a second of two sets of circuit elements (example circuit elements and clocking described subsequently in further detail). The details of the clock doubling logic 111 are known to those skilled in the art. In one of a number of examples of the clock doubling logic 111, both rising edges of cki_i and cki#_i are used to generate two short pulses in one external clock cycle.

Still with reference to FIG. 1, the illustrated memory device 100 also includes a clock buffer or clock buffering logic 112. The clock buffering logic 112 buffers internal clock signal cki_i, and outputs an internal clock signal, 'clki_sdr', which is used to clock each circuit element belonging to a first of the aforementioned two sets of circuit elements (example circuit elements and clocking described subsequently in further detail). Also, clki_sdr provides for SDR operation of at least roughly the same frequency as external clock CKI, and with some amount of delay from cki_i. The amount of delay may match with the delay of clki_ddr.

An input receiver 102A of CSI generates an internal signal 'csi_i', which is delayed by a delay line or delay block 110A. In some examples, the delays of various delay lines mentioned herein may be variable. In other examples, the delays of various delay lines mentioned herein may be fixed. The delayed signal outputted from the delay line 110A is received by one of the inputs of a two-input AND logic gate 105A, and also may also be buffered by an optional buffer block 104A, the output of which is electrically connected to a D input of D-type flip-flop 103A. The flip-flop 103A is driven by the SDR-version clock signal, clki_sdr, and latches the status of the delayed csi_i signal at every rising edges of clki_sdr.

The latched signal csi_lat is provided to the Command/Address Packet Logic 130 and is also provided to buffer logic 109A, which is an optional component in the memory device 100. The output of the optional buffer logic 109A is electrically connected to a D input of another flip-flop 103B. An output signal of the flip-flop 103B, 'cso_lat', is delayed by another delay block 113A, and the delayed signal from the delay block 113A, 'cso_i', is provided to an input of an output driver block 108A. The output driver block 108A outputs the external signal, CSO.

In addition to being provided to delay block 113A, cso_lat is also provided to a multiplexor logic or mux 107 in order to select a "cap_lat2" signal for the output of mux 107. The two stages of the flip-flops 103A and 103B provide an input to output latency of two clock cycles for CSI-to-CSO bypassing.

An input receiver 102C of DSI generates an internal signal 'dsi_i', which is delayed by a delay line 110C. A delayed signal outputted from the delay line 110C is received by one of the inputs of a two-input AND logic gate 105B, and it can also be buffered by an optional buffer block 104B, the output of which is electrically connected to a D input of D-type flip-flop 103I. Following in a series connection configuration, there are two more flip-flop blocks 103J and 103K, for providing for the pipelining of the dsi_i signal. The output of the third D-type flip-flop 103K may be buffered by optional buffer logic 109C, the output of which is electrically connected to a fourth flip-flop 103L.

In the illustrated example embodiment, the four flip-flops 103I through 103L are all driven by the DDR-version clock signal, clki_ddr, with latching of the status of the pipelined dsi_i signal at every rising edges of clki_ddr. 'Dsi_lat', a first latched signal of the flip-flop 103I, is provided to the Data Packet Logic 140. The output signal of the fourth flip-flop 103L, 'dso_lat', is delayed by a delay block 113C, and a delayed signal, 'dso_i', at the output of the delay block 113C is provided to an input of an output driver block 108C. The output driver block 108C outputs the external signal, DSO. Dso_lat from the fourth flip-flop 103L is provided to the multiplexer logic 107 in order to select a "dp_lat2" signal for the output of the multiplexer 107. The four stages of flip-flop logic 103I-103L provide an input to output latency of four half clock cycles for DSI to DSO bypassing.

Still with reference to FIG. 1, the illustrated memory device 100 includes an input receiver block or receiver 102B for receiving the external signal Dn. Those skilled in the art will appreciate that the number of receivers 102B can be more than one depending upon the bit width of Dn. For example, if Dn corresponds to D0, D1, ... D7, for ×8 bit wide I/O version, the receiver 102B will be a total of eight repeated blocks. The output of the receiver 102B, 'din_i', is delayed by a delay line 110B. The delayed signal outputted from the delay line 110B is provided to one input of each of two different AND logic gates 105A and 105B. The other of the inputs of the two-input AND logic gate 105A receives the output of delay block 110A, and the other of the inputs of the two-input AND logic gate 105B receives the output of delay block 110C.

The output of the AND logic gate 105A (designated as 'cap' for command/address packet) is electrically connected to a D-type flip-flop 103C. The flip flop 103C is driven by the SDR-version clock signal, clki_sdr, and latches the status of the cap signal at every rising edges of clki_sdr. The latched signal, 'cap_lat', is provided to the Command/Address Packet Logic 130 and also is provided to optional buffer logic 109B. The output of the optional buffer logic 109B is electrically connected to a D input of another flip-flop 103D. The output signal of the flip-flop 103D, 'cap_lat2', is electrically connected to one of inputs of the multiplexer 107.

The output of the AND logic gate 105B (designated as 'dp' for data packet) is electrically connected to a D-type flip-flop 103E. In a series connection configuration following the flip-flop 103E, there are two more D-type flip-flops 103F and 103G, for the pipelining of the dp signal. The output of the third flip-flop 103G is electrically connected to one of the inputs of a multiplexer 106, and another of the inputs of the multiplexer 106 is driven by a signal, 'core_data', from the Data Packet Logic 140. Core_data may be transferred from the Memory Core 150 to the Data Packet Logic 140 as per a 'PAGE READ' request from a memory controller 10 (FIG. 2). Table 2 below details, in accordance with at least one example, the command/address packet sequence of a PAGE READ command, along with other a number of other memory commands.

TABLE 2

Example Command/Address Packet Sequences

| Operation | 1st Byte | 2nd Byte | 3rd Byte | 4th Byte | 5th Byte |
|---|---|---|---|---|---|
| Page Read | DA | 00h | RA | RA | RA |
| Burst Data Read | DA | 20h | CA | CA | — |
| Burst Data Load Start | DA | 40h | CA | CA | — |
| Burst Data Load | DA | 50h | CA | CA | — |
| Page Program | DA | 60h | RA | RA | RA |
| Block Address Input | DA | 80h | RA | RA | RA |
| Erase | DA | A0h | — | — | — |
| Operation Abort | DA | C0h | — | — | — |
| Read Status Register | DA | F0h | — | — | — |
| Read Device Information Register | DA | F4h | — | — | — |
| Read Link Configuration Register | DA | F7h | — | — | — |
| Write Link Configuration Register | DA | FFh | CONFIG | — | — |

(* DA = Device Address, RA = Row Address, CA = Column Address)

After PAGE READ is completed, the memory controller may, in some examples, request a 'BURST READ' operation from the memory device 100. In such a case, the memory device 100 processes the BURST READ command and the corresponding address information including a Device Address portion. If the Device Address information in the received Command/Address Packet matches the device address stored in the memory device 100, the Command/Address Packet Logic 130 issues an "id_match" signal in order to steer the data flow path of the multiplexer 106. If the id_match signal is logical high logic state as a result of the device address matching process, the multiplexer 106 selects the core_data to be outputted, so that the data from the Memory Core 150 can be transferred to the flip-flop 103H, in part because the output of the multiplexer 106 is connected to a D input of the fourth flip-flop 103H. The four flip-flops 103E through 103H are all driven by the DDR-version clock signal, clki_ddr, and the status of the pipelined dp signal is latched at every rising edge of clki_ddr. A first latched signal, 'dp_lat', is provided to the Data Packet Logic 140.

Still with reference to FIG. 1, the output signal of the flip-flop 103H, dp_lat2, is electrically connected to one of the inputs of the multiplexer 107. From the multiplexer 107, one of two inputs is selected according to the status of cso_lat and dso_lat. If the cso_lat signal is in a logical high logic state, the multiplexer 107 selects the cap_lat2 signal to be outputted, and if dso_lat signal is in a logical high logic state, the multiplexer 107 selects the dp_lat2 signal to be outputted.

The output of the multiplexer 107 is delayed by a delay block 113B. 'Q_i', the delayed signal outputted from the delay block 113B, is provided to the input of an output driver block 108B. The output driver block 108B outputs the external signal, Qn. Similar to Dn and its receiver 102B, those skilled in the art will appreciate that the output driver 108B and the Qn signal can be implemented as multiple numbers of them depending upon the width of the I/O bit configuration that is required. Also, it should be understood that a reason for the delay blocks 113A through 113C is to provide for tuning of input setup time for the next downward memory device (or where the device is the last in the ring, the memory controller). In some examples, the delay blocks 113A through 113C may be programmable for more flexibility. In other examples, such as cases of low frequency design, the delay blocks 113A through 113C may not be necessary.

Other design variations within the scope of example embodiments are contemplated. For example, another multiplexer similar to the multiplexer 107 could be placed prior to the flip-flops 103D and 103H for the multiplexing between command and data packets. Also, with regards to storage elements within the memory device 100 (but not within the memory core 150) while only D-type flip-flops have been shown and described for conciseness, those skilled in the art will appreciate that other types of suitable storage elements besides D-type flip-flops exist.

Reference will now be made to FIG. 2. FIG. 2 is a block diagram of a memory system 1 in accordance with an example embodiment. The memory system 1 includes eight of the memory devices 100 (labeled 100-1 through 100-8) in a ring configuration. Although eight devices are shown for convenience of illustration, it will be understood that the memory system 1 may comprise any suitable number of memory device. Also for convenience of illustration, some of the inputs or signals such as, for example, CE#, RST#, power supplies, etc. are not shown because such details are known to those skilled in the art, and need not be explicitly mentioned herein. The memory controller 10 drives a differential clock bus S111 from its CKO/CKO# outputs, and all the memory devices 100-1 through 100-8 receive the clock signals through their CKI/CKI# clock inputs. The memory controller 10 drives three buses S112, S113 and S114 through its CSO, DSO and Qn outputs, respectively. The first memory device 100-1 receives the three buses S112, S113 and S114 through its CSI, DSI and Dn inputs, respectively. Also, the first memory device 100-1 re-drives buses S112-1, S113-1 and S114-1 through its CSO, DSO and Qn outputs, respectively. Continuing on around the ring, the next memory device 100-2 receives the buses S112-1, S113-1 and S114-1 through its CSI, DSI and Dn inputs, respectively. The above manner of serial interconnection applies to all the illustrated memory devices 100-1 through 100-8. The final buses in the ring, buses S112-8, S113-8 and S114-8, are electrically connected back to the memory controller 10 through its CSI, DSI and Dn inputs, respectively.

Figure 3:
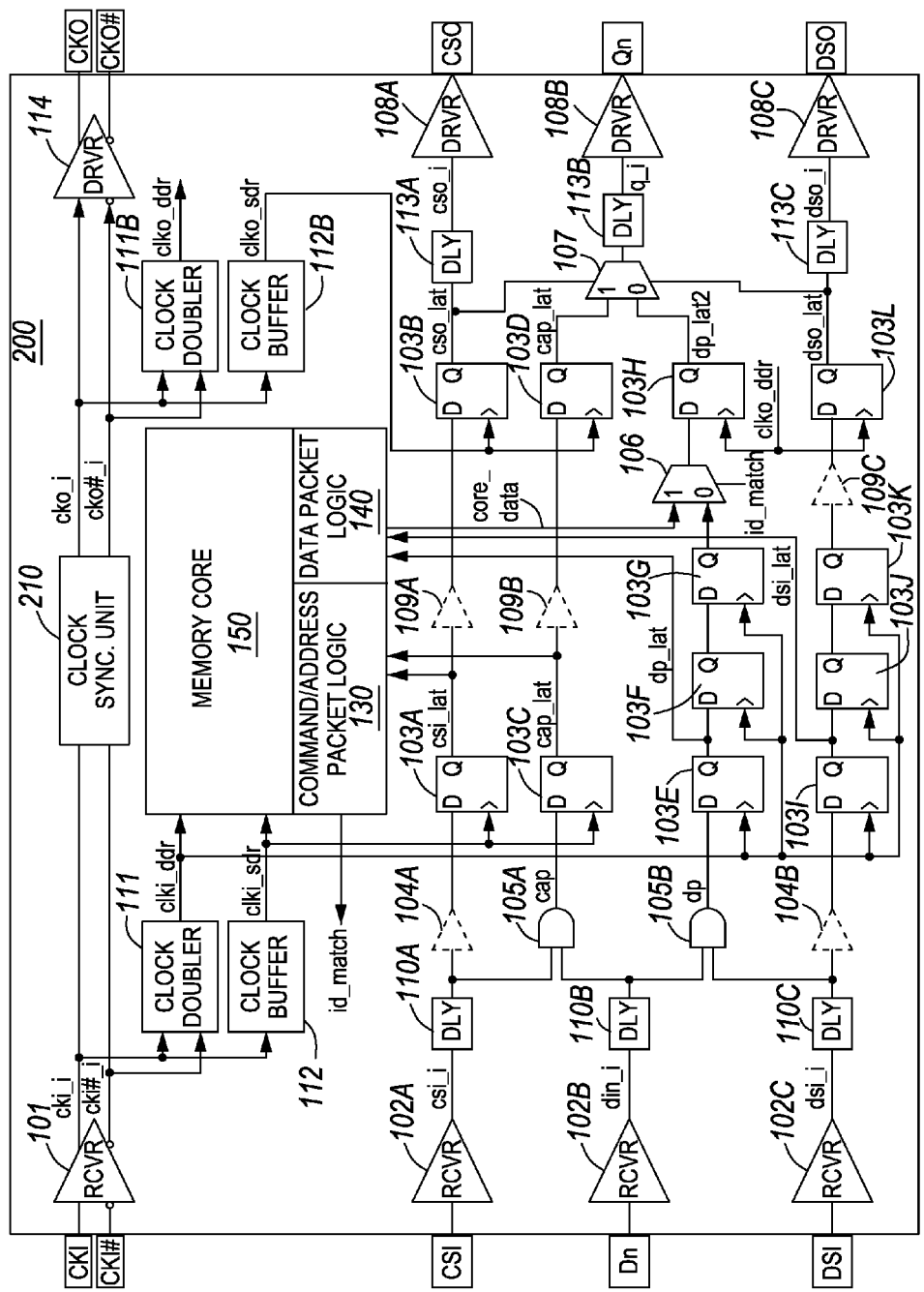
FIG. 3 is a simplified circuit schematic of a memory device in accordance with an alternative example embodiment.

Referring now to FIG. 3, a memory device 200 in accordance with an alternative example embodiment shown. The memory device 200 is very similar to the memory device 100 shown in FIG. 1; however there are some additional circuit blocks to provide for serial interconnection of clock signals in addition to the serial interconnection that is provided for in relation to other signals. The additional circuit blocks include a clock synchronization unit 210, a differential output driver block 114, a second clock doubler 111B, and a second clock buffer block 112B. The clock synchronization unit 210 may comprise, for example, a Phase-Locked-Loop (PLL), a Delay-Locked-Loop (DLL) with Duty Cycle Correction (DCC), or a clock amplifying buffer block with variable delay lines. Without intent to exclude other implementations, further details relating to clock synchronization methods and circuits for serially interconnected memory systems are provided in commonly owned U.S. patent application Ser. No. 11/959,996 entitled "Methods and Apparatus For Clock Signal Synchronization in a Configuration of Series-connected Semiconductor Devices" and U.S. patent application Ser. No. 12/168,091 entitled "Clock Reproducing and Timing Method in a System Having a Plurality of Devices", and the entire contents of these applications are herein incorporated by reference.

Another difference between the memory device 200 and the memory device 100 shown in FIG. 1, is that each of the last stage flip-flops 103B, 103D, 103H and 103L in the respective signal paths are driven by different versions of clock signals ("clko_sdr" and "clko_ddr" from the block 111B and 112B). This facilitates precise matching of the output signals (CSO, DSO and Qn) with clock output signals (CKO/CKO#) satisfying the required setup and hold time margins for the next device.

Figure 4:
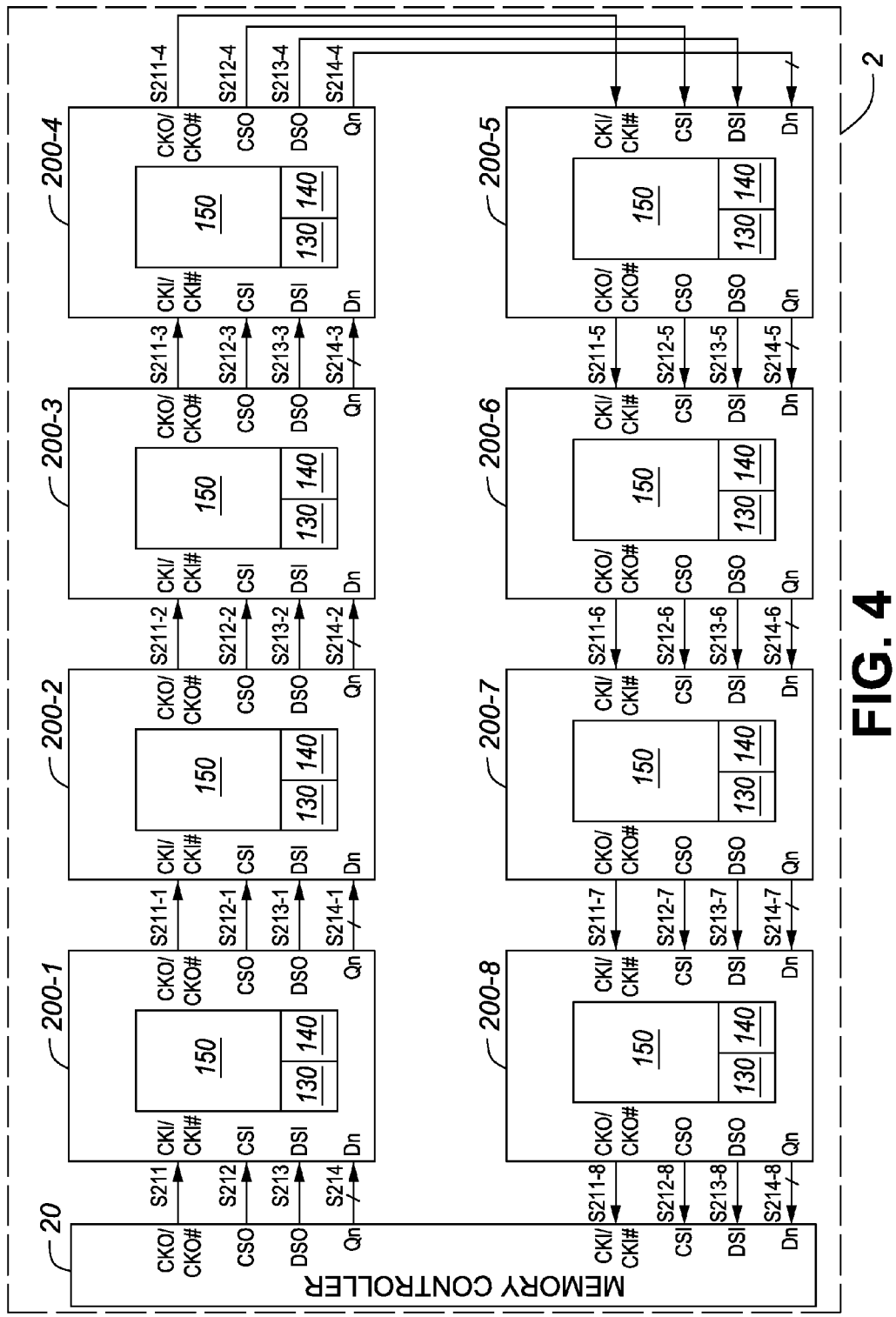
FIG. 4 is a block diagram of a memory system in accordance with an alternative example embodiment.

Referring now to FIG. 4, there is a block diagram of a memory system 2 in accordance with an alternative example embodiment. The memory system 2 is similar to the memory system 1 shown in FIG. 2; however the memory devices 100-1 through 100-8 have been replaced by eight of the memory devices 200 (labeled 200-1 through 200-8). The serial interconnection in between the memory devices of the memory system 2 is similar to that of the memory system 1 shown in FIG. 1, but with additionally serialized clocking scheme instead of a multi-drop manner as shown in FIG. 2.

Figure 5:
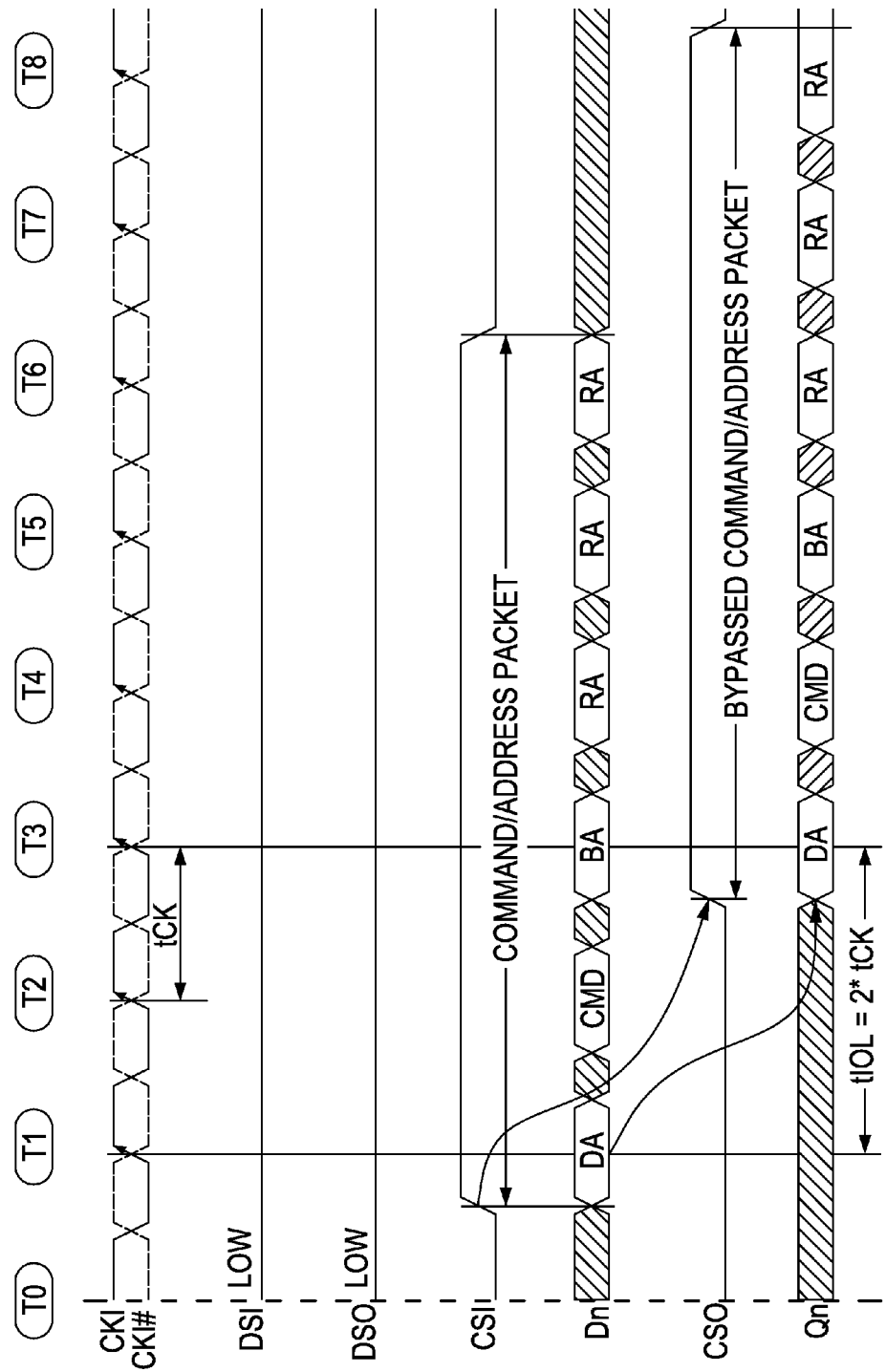
FIG. 5 is an example timing diagram of command and address signal protocol in accordance with an example embodiment.

Reference will now be made to FIG. 5. FIG. 5 is an example timing diagram of command and address signal protocol in accordance with an example embodiment and consistent with DDR operation as previously described. At time T1 in the illustrated timing diagram, the rising edge of CKI (or the falling edge of CKI#) causes the logical high state of CSI to be latched and also simultaneously causes the DA information on Dn to be latched. In at least some examples, the latched DA information is used by circuitry within the memory device to determine whether the command data is intended for a next downstream memory device.

Continuing on to the next labeled rising edge time T2, the memory device latches the Command (CMD) information, and at the third labeled rising edge time T3, the memory device latches the Bank Address (BA) information. The remaining row addresses (three row addresses are each labeled RA) are similarly latched on later rising edges of the CKI signal. It will also be seen from the timing diagram, that the CSO and Qn output signals are echoing the CSI and Dn input signals with a two clock latency of tIOL. Thus, received command data may be bypassed (once received and once determined that the command data is intended for a next downstream memory device). In a similar manner received write data may be bypassed (once received and once determined that the write data is intended for a next downstream memory device).

Figure 6:
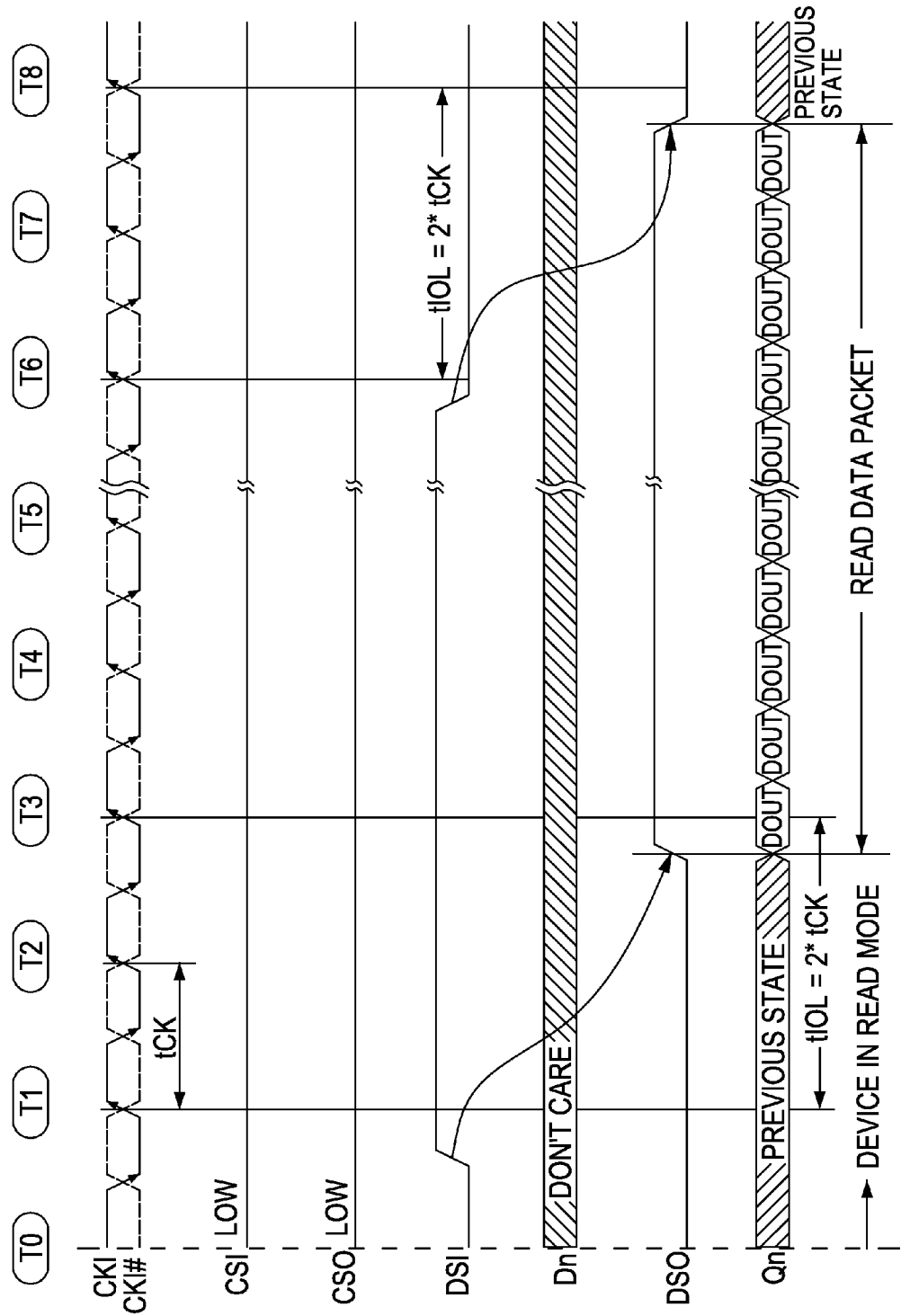
FIG. 6 is an example timing diagram of read data signal protocol in accordance with an example embodiment.

Continuing on with the illustration and description of the example embodiment, FIG. 6 is an example timing diagram of read data signal protocol when the memory device is in "Read-Mode". When the logical high state of DSI is latched on the rising edge of CKI at time T1, the memory device outputs the echoed signal on DSO along with the requested read data information on Qn after a latency tIOL of four half clock cycles as shown in the figure.

Figure 7:
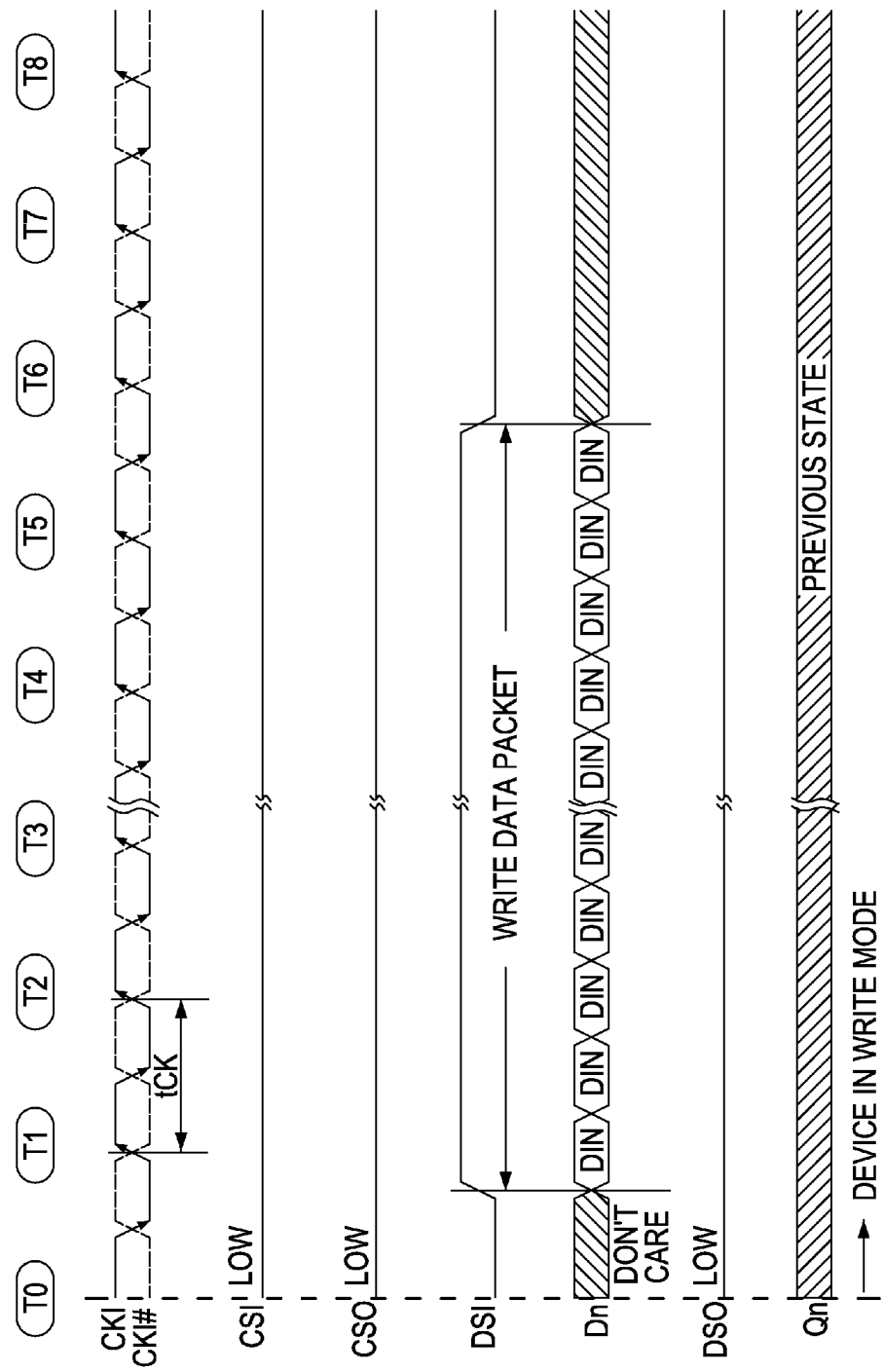
FIG. 7 is an example timing diagram of write data signal protocol in accordance with an example embodiment.

Still continuing on with the illustration and description of the example embodiment, FIG. 7 is an example timing diagram of write data signal protocol when the memory device is in "Write-Mode". In at least some examples, the memory device is pre-conditioned to "Write-Mode" after receipt of a write related command (for example, Burst Data Load). With the matching device address in the Command/Address Packet, the memory device prepares to receive "Write Data Packet" through Dn as delineated by the logical high signal on DSI. At time T1, the first write data information is latched on the rising edge of CKI, and the second write data is latched on the falling edge of CKI, and so on for the remaining data inputs. In contrast with what is shown in the previous timing diagrams, DSO and Qn are not echoing the DSI and Dn signals because of the matching of the memory device with Device Address and the "Write-Mode" pre-conditioning.

Various circuits and circuit components described in the preceding detailed description of example embodiments can be considered to be of a type performing known operations on electronic signals. Those skilled in the art will have knowledge of alternative circuits or circuit components which are recognized as equivalent because they provide the same operations on the signals.

Also, in some instances in which circuit schematics have been presented and described herein, certain details not sufficiently relevant to an understanding of example embodiments may have been omitted so as not to obscure inventive features disclosed herein.

A number of example embodiments can be applied to any suitable solid state memory systems such as, for example, those that include NAND Flash EEPROM device(s), NOR Flash EEPROM device(s), AND Flash EEPROM device(s), DiNOR Flash EEPROM device(s), Serial Flash EEPROM device(s), DRAM device(s), SRAM device(s), Ferro RAM device(s), Magneto RAM device(s), Phase Change RAM device(s), or any suitable combination of these devices.

Certain adaptations and modifications of the described embodiments can be made. Therefore, the above discussed embodiments are considered to be illustrative and not restrictive.

What is claimed is:

1. A system comprising:
    at least one flash memory device and another device defining a ring topology; and
    the flash memory device including:
        i) input circuitry for receiving a clock signal having a frequency at least substantially equal to a frequency x;
        ii) a first set of circuit elements each clocked by a same or a respective first-type internal signal having a frequency at least substantially equal to the frequency x; and
        iii) a second set of circuit elements each clocked by a same or a respective second-type internal signal having a frequency at least substantially double that of the frequency x.

2. The system of claim 1 wherein the flash memory device further includes a command strobe input and a command strobe output.

3. The system of claim 2 wherein the flash memory device further includes a driver and an electrical path, the electrical path extending from the command strobe input, through storage elements of the first set of circuit elements to the command strobe output, the first-type internal signal and the storage elements enabling the driver to provide a strobe signal at the command strobe output.

4. The system of claim 1 wherein the flash memory device further includes a clock synchronization unit, at least one clock output and clock driver circuitry, the clock synchronization unit for receiving the clock signal from the input circuitry and enabling the clock driver circuitry to provide delayed versions of the clock signal at the clock output.

5. The system of claim 1 wherein the flash memory device further includes a data strobe input, a data strobe output, at least one data input and at least one data output.

6. The system of claim 5 wherein the flash memory device further includes at least one data output driver and at least one internal data path, the internal data path for carrying write data internally clocked through storage elements of the second set of circuit elements, the data output driver for providing the write data on the data output.

7. The system of claim 6 wherein the another device is a memory controller, and the write data is transmitted to the flash memory device from the memory controller.

8. The system of claim 1 wherein the another device is a memory controller having output circuitry in electrical communication with the input circuitry of the flash memory device.

9. The system of claim 1 wherein the circuit elements of the first and second sets are D flip-flops.

10. The system of claim 1 wherein the at least one flash memory device is a plurality of flash memory devices.

11. The system of claim 1 wherein the input circuitry receives differential clock signals comprising the clock signal and another signal that is a complement of the clock signal.

12. A method carried out in a semiconductor memory device having at least one data input and at least one data output, the method comprising:
    clocking read data, when a read operation occurs, out through the data output, and at a first rate at least double that of a second rate; and
    bypassing received command data, when received and when determined that the command data is intended for a next downstream semiconductor memory device, the bypassing including clocking the command data out through the data output at the second rate.

13. The method of claim 12 further comprising:
    receiving differential clock signals each of which has a frequency at least substantially equal to a frequency x.

14. The method of claim 13 further comprising:
    producing, from the differential clock signals, an internal signal having a frequency at least substantially double that of the frequency x, the internal signal facilitating the clocking of the read data.

15. The method of claim 12 further comprising:
    capturing write data, when a write operation occurs, at the first rate; and
    in sequence with the capturing, transferring the write data to more permanent storage within the semiconductor memory device.

16. The method of claim 12 further comprising:
    receiving write data at the data input;
    determining whether the write data is intended for the next downstream semiconductor memory device; and
    if the write data is intended for the next downstream semiconductor memory device, bypassing the received write data, the bypassing including clocking the write data out through the data output at the first rate.

17. The method of claim 12 wherein some bits of the command data provide device address information.

18. The method of claim 17 wherein the command data is intended for the next downstream semiconductor memory device if the device address information corresponds to a device address of the next downstream semiconductor memory device.

19. The method of claim 17 further comprising:
    outputting from another output of the semiconductor memory device, a strobe that delineates a length of the command data provided at the data output.

20. A system comprising:
    at least one semiconductor memory device and another device defining a ring topology; and
    the semiconductor memory device including:
        i) input circuitry for receiving a clock signal;
        ii) a plurality of data input pins configured to receive both command data and other data at different times;

iii) first circuitry configured to employ the clock signal to clock in the other data, received on the data input pins, at a first rate at least double that of a second rate; and iv) second circuitry configured to employ the clock signal to clock in the command data, received on the data input pins, at the second rate.

21. The system of claim 20 wherein the other data is write data.

22. The system of claim 20 wherein the semiconductor memory device further includes a clock synchronization unit, at least one clock output and clock driver circuitry, the clock synchronization unit for receiving the clock signal from the input circuitry and enabling the clock driver circuitry to provide delayed versions of the clock signal at the clock output.

23. The system of claim 22 wherein the clock synchronization unit comprises a phase locked loop or a delay locked loop.

24. The system of claim 20 wherein the another device is a memory controller and the at least one semiconductor memory device is a plurality of semiconductor memory devices.

25. The system of claim 20 wherein the input circuitry receives differential clock signals comprising the clock signal and another signal that is a complement of the clock signal.

* * * * *